(12) United States Patent
Hu et al.

(10) Patent No.:  US 12,603,140 B2
(45) Date of Patent:      Apr. 14, 2026

(54) SOFT PROGRAMMING METHOD AND ERASING METHOD FOR MEMORY DEVICE

(71) Applicant: MACRONIX International Co., Ltd., Hsinchu (TW)

(72) Inventors: Chih-Wei Hu, Miaoli County (TW); Chih-Chang Hsieh, Hsinchu City (TW); Teng-Hao Yeh, Hsinchu County (TW); Hang-Ting Lue, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 80 days.

(21) Appl. No.: 18/754,159

(22) Filed: Jun. 26, 2024

(65) Prior Publication Data

US 2026/0004859 A1      Jan. 1, 2026

(51) Int. Cl.
    *G11C 16/34*      (2006.01)
    *G11C 16/10*      (2006.01)
    *G11C 16/16*      (2006.01)

(52) U.S. Cl.
    CPC ........ *G11C 16/3459* (2013.01); *G11C 16/102* (2013.01); *G11C 16/16* (2013.01)

(58) Field of Classification Search
    CPC .... G11C 16/3459; G11C 16/102; G11C 16/16
    USPC ..................................... 365/185.18, 189.011
    See application file for complete search history.

(56) References Cited

U.S. PATENT DOCUMENTS

| | | | |
|---|---|---|---|
| 2005/0057997 A1 | 3/2005 | Mitani et al. | |
| 2010/0097855 A1 | 4/2010 | Bayle | |
| 2010/0302860 A1 | 12/2010 | Oh | |
| 2020/0350022 A1 | 11/2020 | Choo | |

(Continued)

FOREIGN PATENT DOCUMENTS

| | | |
|---|---|---|
| CN | 1467752 | 1/2004 |
| CN | 103680622 | 3/2014 |
| CN | 103871466 | 6/2014 |

(Continued)

OTHER PUBLICATIONS

Office Action of Taiwan Counterpart Application, issued on Sep. 4, 2025, p. 1-p. 8.

(Continued)

*Primary Examiner* — Huan Hoang
(74) *Attorney, Agent, or Firm* — J.C. PATENTS

(57) ABSTRACT

A soft programming method and an erasing method for a memory device having n (positive integer) word lines are provided. The soft programming method includes: applying m (positive integer) programming pulses to the j-th word line of the n word lines, where j is a positive integer smaller than n; and determining an initial value of a programming pulse applied to the (j+1)-th to the n-th word lines based on a verification result of applying the m programming pulses to the j-th word line. When the i-th programming pulse, among the m programming pulses applied to the j-th word line, passes verification, the i-th programming pulse is set as the initial value of the programming pulse for the (j+1)-th to the n-th word lines, where i=1 to m. This method is also applicable to a 3D NAND flash memory. The memory device has high capacity and high performance.

16 Claims, 10 Drawing Sheets

(56)                 References Cited

U.S. PATENT DOCUMENTS

2024/0168642 A1*   5/2024   Wan .................. G11C 16/0483

FOREIGN PATENT DOCUMENTS

| TW | 559818 | 11/2003 |
| TW | 201333952 | 8/2013 |
| TW | 201415461 | 4/2014 |

OTHER PUBLICATIONS

"Office Action of Taiwan Counterpart Application", issued on Mar. 17, 2025, p. 1-p. 5.

* cited by examiner

SOFT PROGRAMMING METHOD AND ERASING METHOD FOR MEMORY DEVICE

BACKGROUND

Technical Field

The disclosure relates to an operating method for a memory device, and particularly relates to a programming method for a memory device.

Description of Related Art

As the density of 3D NOR flash memory increases, the total erase time required for an erasing operation becomes longer, which may cause the performance of the memory device to degrade. Generally speaking, when an erasing operation is performed, a so-called bit by bit soft programming (BYBSPG, hereinafter referred to as soft programming) operation is further performed on all the word lines. The soft programming operation can increase the lower bound (LB) value of the erase state and make the distribution of the erase state more compact. Therefore, the optimization of conditions of the soft programming operation after applying an erase voltage is critical for saving the erase time and improving the memory cell endurance performance.

FIG. 1 illustrates a voltage waveform diagram of a conventional soft programming operation. As shown in FIG. 1, after a flash memory is erased, a soft programming operation is performed on each of the word lines WL1, WL2, . . . . WLn in the array of the flash memory. First, a pre-verification voltage PV0 is applied to the word line WL1. If the word line WL1 fails to pass the verification, multiple shots of programming pulses, such as 4 shots V1 to V4, are applied to perform a soft programming operation. After applying each of the programming pulses V1 to V4, post verification voltages PV1 to PV4 are respectively applied so as to determine whether the word line passes the verification. Here, the other word lines WL2 to WLn are processed in the same manner.

However, in the approach described above, the soft programming operation is performed on each of the word lines WL1 to WLn, and all the programming pulses need to be applied starting from the first shot of programming erase pulses. This increases the time of the total erasing operation. Therefore, how to reduce the time of soft programming without compromising the effect of soft programming is an issue that needs to be addressed.

SUMMARY

Based on the above description, an embodiment of the disclosure provides a soft programming method for a memory device. The memory device includes n word lines (n is a positive integer). The soft programming method includes: applying m programming pulses (m is a positive integer) to a j-th word line among the n word lines, where j is a positive integer smaller than n; and determining an initial value of a programming pulse applied to a (j+1)-th word line to an n-th word line based on a verification result of applying the m programming pulses to the j-th word line. In response to an i-th programming pulse, among the m programming pulses applied to the j-th word line, passing a verification, the i-th programming pulse is set as the initial value of the programming pulse applied to the (j+1)-th word line to the n-th word line, where i=1 to m.

Another embodiment of the disclosure provides an erasing method for a memory device. The memory device includes n word lines (n is a positive integer). The erasing method includes: applying an erase voltage to a plurality of memory cells on the n word lines to perform a block erase; applying m programming pulses (m is a positive integer) to a j-th word line among the n word lines, where j is a positive integer smaller than n; and determining an initial value of a programming pulse applied to a (j+1)-th word line to an n-th word line based on a verification result of applying the m programming pulses to the j-th word line. In response to an i-th programming pulse, among the m programming pulses applied to the j-th word line, passing a verification, the i-th programming pulse is set as the initial value of the programming pulse applied to the (j+1)-th word line to the n-th word line, where i=1 to m.

According to an embodiment of the disclosure, the soft programming method or erasing method further includes: applying a pre-verification voltage to each of the n word lines before applying the m programming pulses to each of the n word lines, in which the j-th word line is a word line of the n word lines that firstly fails to pass the pre-verification voltage and starts to be applied with the m programming pulses.

According to an embodiment of the disclosure, in the soft programming method or erasing method, the j-th word line is a first word line among the n word lines.

According to an embodiment of the disclosure, the soft programming method or erasing method further includes: sequentially applying the i-th programming pulse to an m-th programming pulse to each of the (j+1)-th word line to the n-th word line; and further applying an i-th post verification voltage to an m-th post verification voltage after applying each of the i-th programming pulse to the m-th programming pulse.

According to an embodiment of the disclosure, in the soft programming method or erasing method, at least one of verifications of the i-th post verification voltage to an (m-2)-th post verification voltage is not performed, where m-2>i.

According to an embodiment of the disclosure, the soft programming method or erasing method further includes: determining an initial value of a programming pulse applied to a (j+k+1)-th word line to the n-th word line based on the verification result of applying the m programming pulses to the j-th word line to a verification result of applying the m programming pulses to a (j+k)-th word line, where k is a positive integral and j+k<n.

According to an embodiment of the disclosure, the soft programming method or erasing method further includes: determining the initial value of the programming pulse applied to the (j+k+1)-th word line to the n-th word line by averaging the initial value of the programming pulse obtained based on the verification result of applying the m programming pulses to the j-th word line to an initial value of a programming pulse obtained based on the verification result of applying the m programming pulses to the (j+k)-th word line, where k is a positive integral and j+k<n.

According to an embodiment of the disclosure, in the soft programming method or erasing method, averaging the initial value is performed by an arithmetic average.

According to an embodiment of the disclosure, in the soft programming method or erasing method, the memory device is a 3D NOR flash memory.

Based on the above, the soft programming method provided by the embodiments of the disclosure can improve reliability and performance with lower cost. In addition, by implementing the embodiments of the disclosure, the time required for the total erasing operation can be further reduced, and the erasing operation is easy to perform, which also improves the chip yield.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
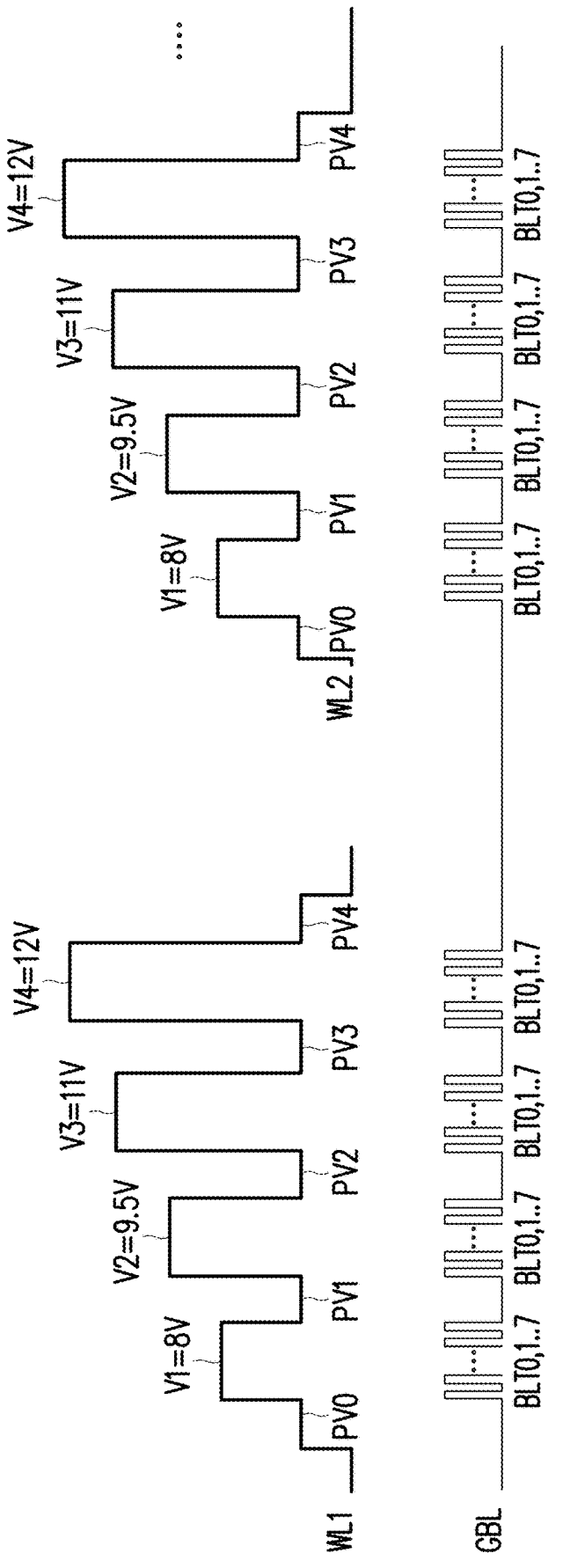
FIG. 1 is a voltage waveform diagram of a conventional soft programming operation.
Figure 2:
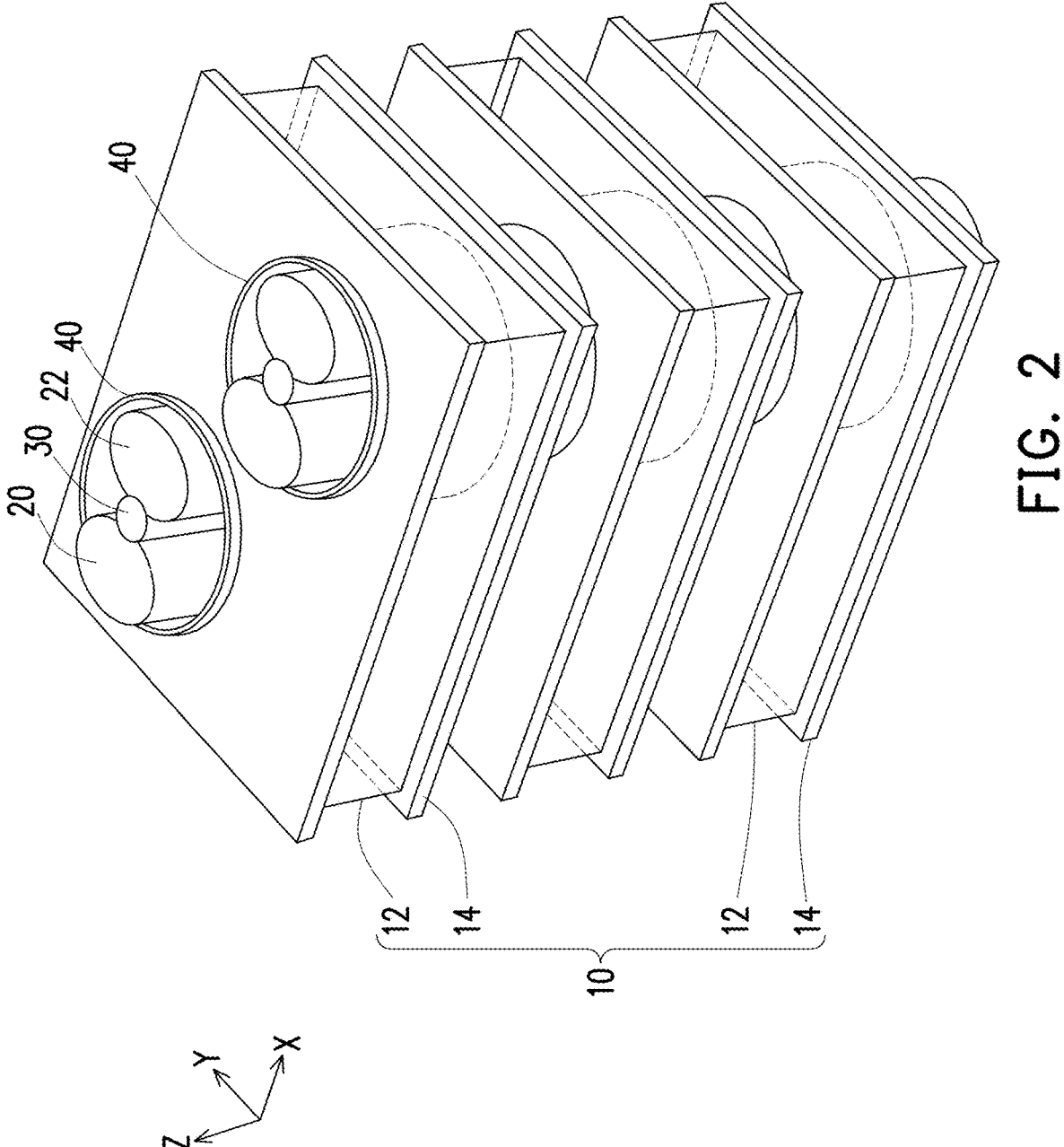
FIG. 2 is a structural diagram of a 3D NOR flash memory to which an embodiment of the disclosure can be applied.

FIG. 2 is a schematic diagram illustrating a structure of a 3D NOR flash memory to which an embodiment of the disclosure can be applied. Nevertheless, FIG. 2 is merely a conceptual diagram. The specific structure of the 3D NOR flash memory may be any structure that is currently available or can be implemented in the future. The memory array of the memory device includes a gate stack structure 10, a plurality of first conductive pillars (also referred to as source pillars or electrode pillars) 20, a plurality of second conductive pillars (also referred to as called drain pillars or electrode pillars) 22, insulating pillars 30, a plurality of doped channel rings 40, and a plurality of charge storage structures (not shown).

The first conductive pillars 20, the second conductive pillars 22, and the insulating pillars 30 respectively extend in a direction (that is, Z direction) perpendicular to the surface of a gate layer 12 (that is, XY plane). The first conductive pillars 20 and the second conductive pillars 22 are separated by the insulating pillars 30. The first conductive pillars 20 and the second conductive pillars 22 include doped polycrystalline silicon or metal material. The insulating pillar 30 is, for example, silicon nitride or silicon oxide.

The gate stack structure 10 includes a plurality of vertically stacked gate layers (also referred to as word lines) 12 and insulating layers 14 (for example, ONO structure). In the Z direction, these gate layers 12 are electrically isolated by the insulating layers 14 disposed therebetween. The charge storage structures, the doped channel rings 40, the source pillars 20, and the drain pillars 22 are surrounded by the gate layers 12 and define memory cells.

Figure 3:
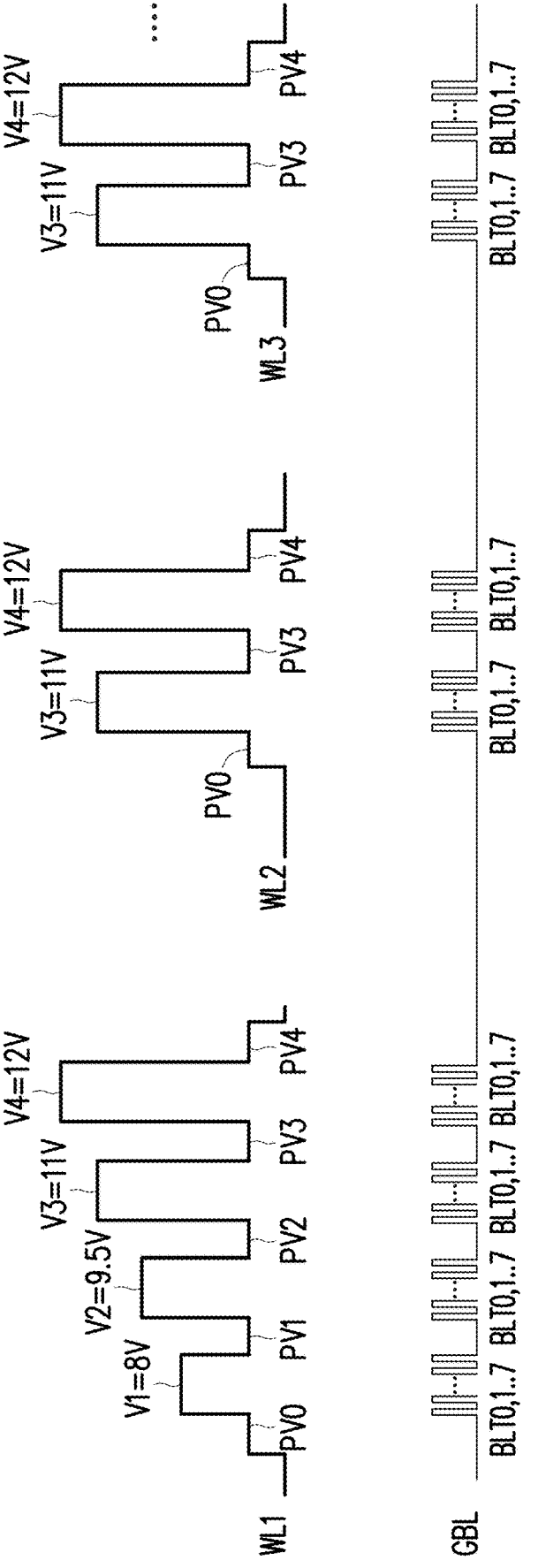
FIG. 3 is a voltage waveform diagram of the soft programming operation according to an embodiment of the disclosure.

FIG. 3 is a voltage waveform diagram of a soft programming operation according to an embodiment of the disclosure. In addition, FIG. 3 illustrates a 3D NOR flash memory as an example. In the example of FIG. 3, the soft programming operation is performed on the word lines of each page in the memory array one by one and the operations for all the pages are the same. Generally, when performing the soft programming operation, multiple shots of programming pulse are applied to each word line WL, such as m shots, where m is a positive integer. To facilitate the explanation of the embodiment of the disclosure, in the following description, 4 shots will be illustrated as an example. For example, a soft program operation is performed on the word line WL0, which includes 4 shots of programming pulses, that is, V1=8V, V2=9.5V, V3=11V, and V4=12V as shown in the drawing. Namely, the voltage values of the programming pulses V1 to V4 gradually increase. In addition, the voltage values illustrated here are merely examples and are not intended to limit the embodiment of the disclosure. Further, the word line WLj includes multiple lines, for example, n lines, where j=1 to n, and n is an integer. Although this embodiment and the following embodiments only illustrate word lines WL1, WL2, WL3, and so on, there are actually more word lines WL.

As shown in FIG. 3, when performing the soft programming operation on all the word lines, generally the soft programming operation is performed on the word lines WL1, WL2, WL3, . . . . WL32 sequentially. In this example, it is assumed that there are 32 word lines. According to an embodiment of the disclosure, the number of programming pulses for soft programming (number of shots) applied to the first word line WL1 is a preset number, that is, m shots. In this example, the number of programming pulses is 4 shots. After each shot is applied, a programming verification is performed, that is, the post verification voltages PV1 to PV4 shown in FIG. 3 are applied. Then, the result of soft programming the word line WL1, that is, whether the word line WL1 passes the verification after being applied with the post verification voltages, is fed back to each of the subsequent word lines WL2 to WL32. In other words, the initial value of the programming pulse applied to each of the word lines WL2 to WL32, that is, the i value that indicates a start shot, is determined according to the result of the soft programming to the word line WL1, where i is an integral greater than 1. In this manner, the number of shots of the programming pulses applied to other word lines WL2~WL32 can be reduced. The initial value of the programming pulse applied to each of the word lines WL2 to WL32 is searched by this process based on the result of soft programming to the word line WL1.

Next, the search procedure will be described in detail. First, the pre-verification voltage PV0 is applied to the word line WL1. If the word line WL fails to pass the verification, the programming pulse V1 is applied to the word line WL1. Then, the post verification voltage PV1 is applied to the word line WL1. If the word line WL1 fails to pass the verification, the programming pulse V2 is applied to the word line WL1, and then the post verification voltage PV2 is applied to the word line WL1. In this way, the programming pulse V3, the post verification voltage PV3, the programming pulse V4, and the post verification voltage PV4 are applied to the word line WL1.

As an example, it is assumed that, during the soft programming to the word line WL1, the post verification voltage PV3 is applied after the third shot of programming pulse V3=11V is applied to the word line WL1. Then, when the word line WL1 passes the verification of the post verification voltage PV3, the control system (such as existing logic circuit, control circuit, etc.) of the memory device feeds back this verification result and determines the conditions for applying programming pulses to the subsequent word lines WL2 to WL32. Here, since the word line WL1 passes the verification of the post verification voltage PV3, the condition for applying the programming pulses to the second word line WL2 is no longer to apply starting from the first shot of programming pulse V1, but starting from the third shot of programming pulse V3=11V based on the verification result of the word line WL1.

According to the above description, it may feedback that the first shot of programming pulse V1 and the second shot of programming pulse V2 are relatively ineffective for the soft programming operations for the subsequent word lines, based on the verification result of applying the programming pulses during the soft programming to the word line WL1. Therefore, based on the verification result of the soft programming to the word line WL1, it can be found that it is beneficial to perform the soft programming operations on the subsequent word lines WL2 to WL32 starting from the third shot of programming pulse V3.

That is, as shown in FIG. 3, when performing the soft programming operation on the word line WL2, first the pre-verification voltage PV0 is applied to the word line WL2. After the pre-verification voltage PV0 is applied, if the word line WL2 fails to pass the verification, the programming pulse for the soft programming starts to be applied to the word line WL2. At this time, the programming pulse is applied not from the first shot of programming pulse V1, but from the third shot of programming pulse V3=11V. After the programming pulse V3 is applied to the word line WL2, the post verification voltage PV3 is applied. If the word line WL2 fails to pass the verification, the fourth shot of programming pulse V4=12V is then applied, and then the post verification voltage PV4 is applied to perform the verification.

Furthermore, the soft programming operation for the word line WL3 is also performed in the same manner as above. Based on the verification result of the soft programming operation of the word line WL1, the soft programming operation for the word line WL3 is the same as that for the word line WL2, the programming pulses are applied starting from the third shot of programming pulse V3=11V rather than the first shot of programming pulse V1. After the programming pulse V3 is applied to the word line WL3, the post verification voltage PV3 is applied. If the word line WL3 fails to pass the verification, the fourth shot of programming pulse V4=12V is then applied, and then the post verification voltage PV4 is applied. Similarly, the soft programming operations for the word lines WL4 to WL32 are performed in the same manner as the word lines WL2 and WL3.

Based on the above description, when performing the soft programming operations on the word lines WL2 to WL32, the number of programming pulses is reduced from 4 shots to 2 shots. Namely, by feeding back the verification result of the soft programming to the word line WL1 as a reference for the operation conditions for other word lines, the bias condition of the soft programming suitable for subsequent word lines can be searched. Therefore, the time of the entire soft programming operation can be reduced, and the total time of the overall erasing operation can be significantly reduced as well.

In summary, when performing the soft programming operation by applying m shots of programming pulses to the word line WLj (for example, j=1), if the verification result of the soft programming operation of the word line WLj (for example, j=1) indicates that the i-th shot of programming pulse can pass the verification, the bias conditions for the soft programming operations for other word lines WLj (for example, j=2 to 32) are set to start from the i-th shot.

Figure 4:
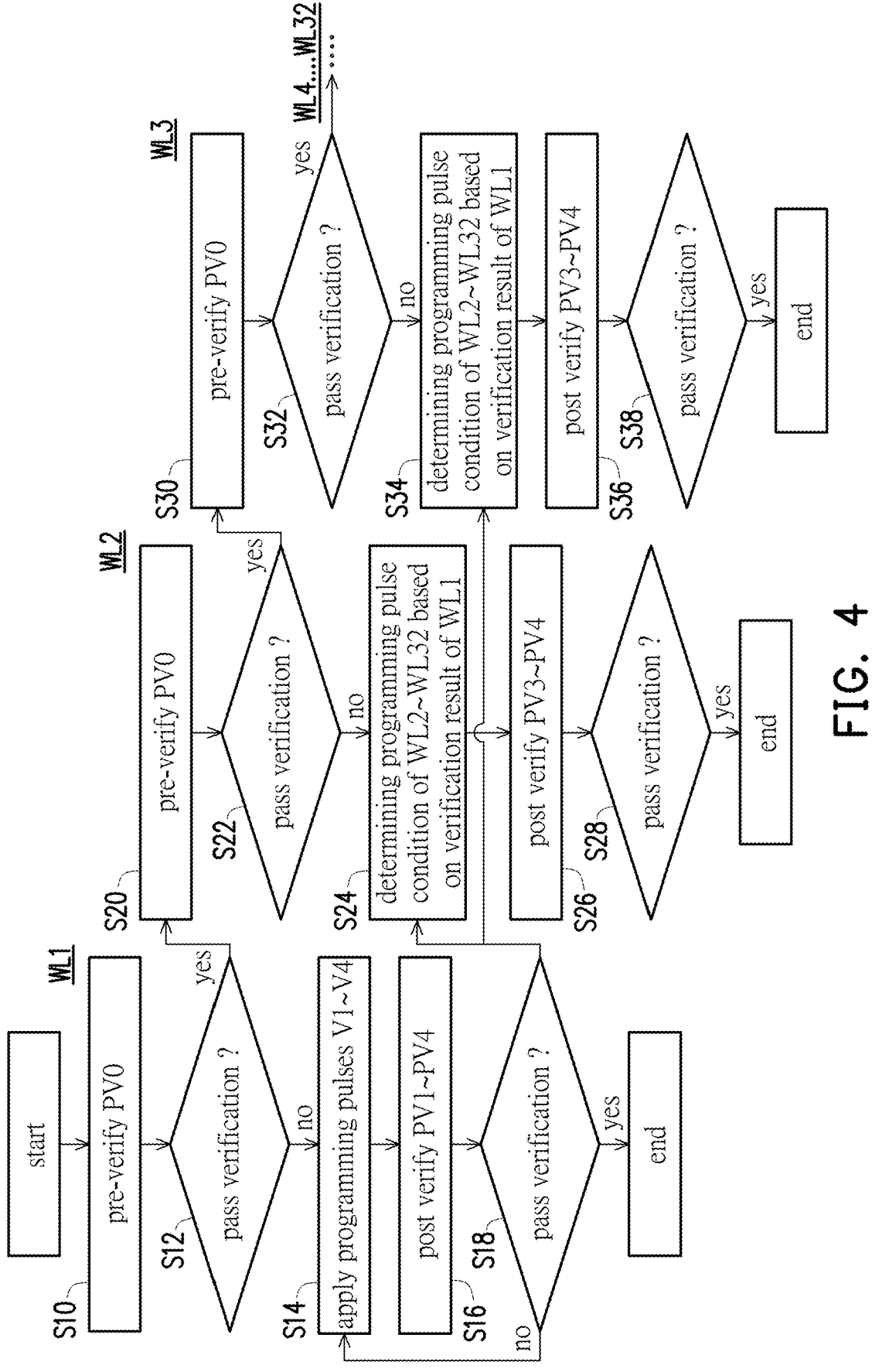
FIG. 4 is a flowchart of the soft programming operation according to an embodiment of the disclosure.

FIG. 4 is a simplified flowchart of the soft programming operation according to an embodiment of the disclosure. As shown in FIG. 4 and FIG. 3, in step S10, the pre-verification voltage PV0 is applied to the word line WL0. In step S12, it is determined whether the state of the memory cells on the word line WL1 can pass the verification. If the word line WL1 passes the verification of the pre-verification voltage PV0, it means that the soft programing operation is not required and step S20 is executed to perform the soft programming operation on the word line WL2, and the pre-verification voltage PV0 is applied by the same process described above.

In step S12, if the word line WL1 fails to pass the verification of the pre-verification voltage PV0, programming pulses of the soft programming operation are applied to the word line WL1 in step S14. For example, the programming pulses V1 to V4 shown in FIG. 3 are applied sequentially. After the first shot of programming pulse V1=8V is applied, the first post verification voltage PV1 is applied to the word line WL1 in step S16. Then, in step S18, it is determined whether the state of the memory cells on the word line WL1 can pass the verification. If the word line WL1 fails to pass the verification, the process returns to step S14, and the second shot of programming pulse V2=9.5V is applied to the word line WL1. Similarly, in step S16, the second post verification voltage PV2 is applied to the word line WL1. Then, in step S18, it is determined whether the state of the memory cells on the word line WL1 can pass the verification. Steps S14 to S18 are repeated in the same manner until passing post verification or until all the programming pulses V1 to V4 are applied.

Furthermore, when one of the programming pulses V1 to V4 passes the verification in step S18, the soft programming operation for the word line WL1 ends. Then, the soft programming operation for the word line WL2 starts.

In step S20, the pre-verification voltage PV0 is applied to the word line WL2. In step S22, it is determined whether the state of the memory cells on the word line WL2 can pass the verification. If the word line WL2 passes the verification of the pre-verification voltage PV0, step S30 is executed to perform the soft programming operation on the word line WL3, and the pre-verification voltage PV0 is applied.

In step S22, if the word line WL2 fails to pass the verification of the pre-verification voltage PV0, programming pulses of the soft programming operation are applied to the word line WL2 in step S24. Here, the initial value of the programming pulse of the soft programming operation to be applied to the word line WL2 is determined based on the verification result of the word line WL1 in steps S14 to S18. In the example shown in FIG. 3, if the word line WL1 passes the third post verification voltage PV3 of the third shot of programming pulse V3, the third shot of programming pulse V3 is set as the initial value of the programming pulse of the soft programming operation to be applied to the word line WL2. In other words, the third shot of programming pulse V3 is used as a start programming pulse to perform the soft programming operation on the word line WL2.

As shown in FIG. 3, the programming pulses V3 to V4 are applied sequentially. After the third shot (first shot for the word line WL1) of programming pulse V3=11V is applied, the third post verification voltage PV3 is applied to the word line WL2 in step S26. Then, in step S28, it is determined whether the state of the memory cells on the word line WL2 can pass the verification. If the word line WL2 fails to pass the verification, the process returns to step S24, and the fourth shot of programming pulse V4=12V is applied to the word line WL2. Similarly, in step S26, the fourth post verification voltage PV4 is applied to the word line WL2. Then, in step S28, it is determined whether the state of the memory cells on the word line WL2 can pass the verification. If the word line WL2 passes the verification, the soft programming operation for the word line WL2 ends. In addition, since the fourth shot of programming pulse V4 is the last shot, and thus even though the word line WL2 fails to pass the verification, the soft programming operation for the word line WL2 ends.

Similarly, for the word line WL3, the pre-verification voltage PV0 is applied to the word line WL3 in step S30. If the word line WL3 passes the verification, the soft programming operation of the word line WL4 is continued in the same manner. On the other hand, if it is determined in step S32 that the word line WL3 fails to pass the verification of the pre-verification voltage PV0, the soft programming operation on the word line WL3 starts in step S34. Here, as described above, the initial value of the programming pulse of the soft programming operation to be applied to the word line WL3 is also determined based on the verification result of the word line WL1 in steps S14 to S18. In this example, the third shot of programming pulse V3 is set as the initial value of the programming pulse of the soft programming operation to be applied to the word line WL3. That is, in steps S36 and S38, similar to steps S26 and S28 described above, the soft programming operation is performed on the word line WL3 with the third shot of programming pulse V3 as the initial value, until passing the verification. After passing the verification, the soft programming operation for the word line WL3 ends, and the soft programming operation for the word line WL4 starts. The soft programming operations for all the word lines WL4 to WL32 are performed and completed in the same manner.

As described above, in the conventional approach as mentioned above, the soft programming for each word line needs to start with the first shot of multiple programming pulses. However, according to the embodiment of the disclosure, a more appropriate initial value of the programming pulse can be searched from multiple programming pulses based on the verification result of the word line WL1. Accordingly, the number of shots of programming pulses to be applied can be reduced for the subsequent word lines WL2 to WL32, thereby reducing the time of the overall soft programming and thus reducing the total erase time.

Although the above example uses the word line WL1 as a reference, the disclosure is not limited to using the word line WL1 as the reference. In the embodiment described above, the soft programming operation of multiple programming pulses is performed when the word line WL1 fails to pass the verification of the pre-verification voltage PV0. However, the processing of FIG. 4 may immediately proceed to the verification of the pre-verification voltage PV0 for the word line WL2 when the word line WL1 passes the verification of the pre-verification voltage PV0. If the word line WL2 fails to pass the verification of the pre-verification voltage PV0, the programming pulses of the soft programming operation start to be applied to the word line WL2. In this case, the embodiment of the disclosure may use the verification result of the soft programming operation for the word line WL2 as a reference to feed back an appropriate initial value of the programming pulse to the other word lines WL3 to WL32.

In other words, when sequentially performing the soft programming operations on the word lines WL1 to WL32, when the word line WLj (j=1 to n) is determined as the first one of word lines WL1~WL32 that fails to pass the verification of the pre-verification voltage PV0, resulting in the soft programming operation of applying multiple programming pulses to the word line WLj, the word line WLj is used as the reference, and the verification result thereof is used to determine the initial values of the programming pulses for the other word lines WLj+1 to WLn.

Figure 5B:
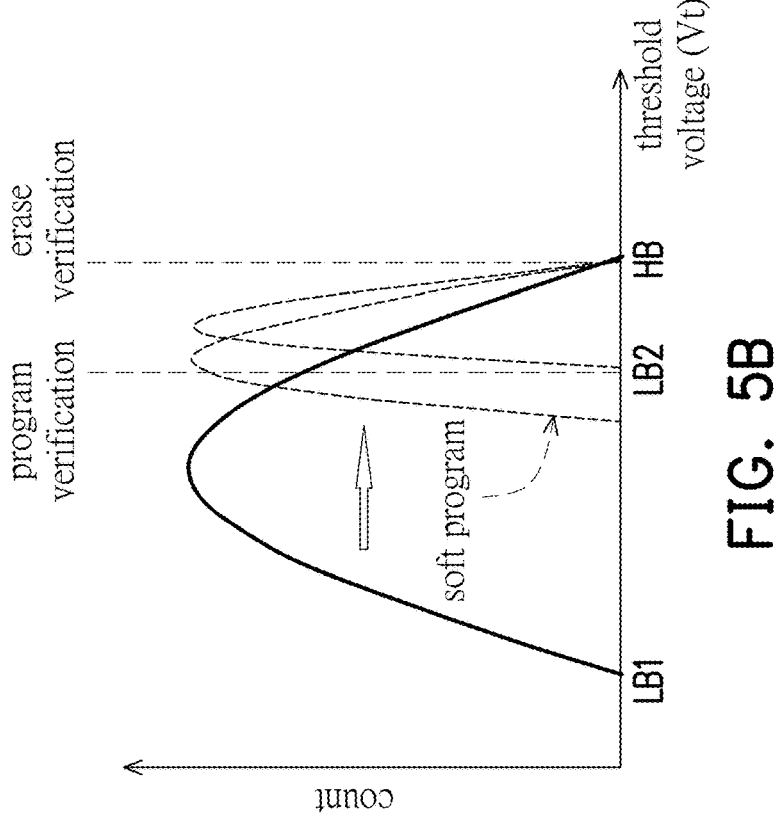
FIG. 5A and FIG. 5B are diagrams of erase state distribution after the soft programming operation according to an embodiment of the disclosure.
Figure 5A:
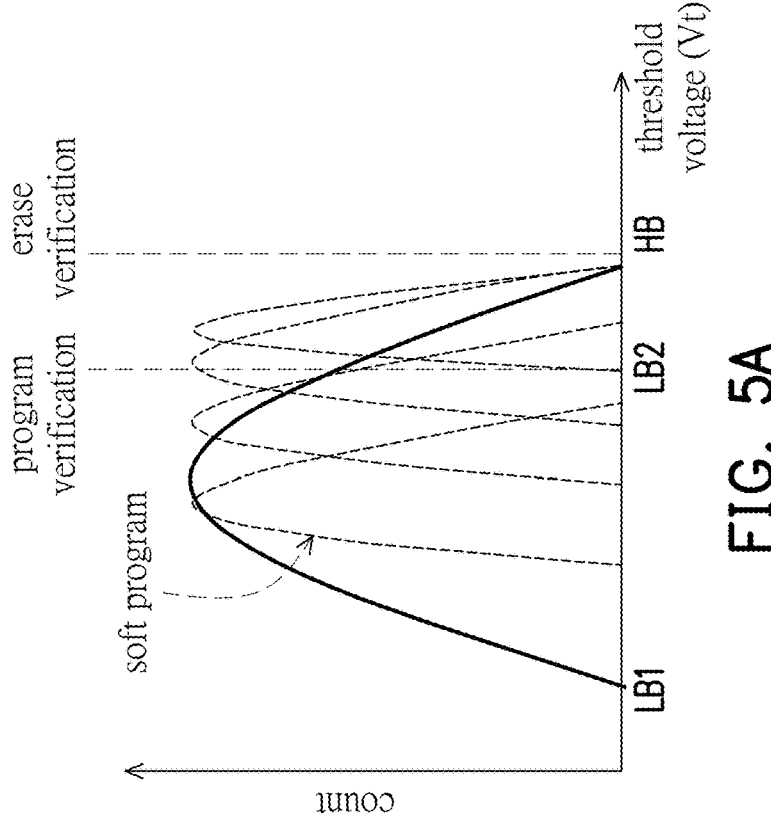

FIG. 5A and FIG. 5B are diagrams illustrating the threshold voltage distribution of the erase state after the soft programming operation according to an embodiment of the disclosure. Referring to FIG. 3 and FIG. 5A to FIG. 5B, FIG. 5A shows the threshold voltage distribution of the erase state ERS after erasing the word line WL1 and applying 4 shots of programming pulses (indicated by dotted lines). It can be seen from FIG. 5A that, after 4 shots of programming pulses, the threshold voltage distribution of the erase state ERS becomes more compact, and the lower bound of the erase state ERS can rise from LB1 to LB2. Further, as shown in FIG. 5B, based on the soft programming verification result of the word line WL1 described above, the number of programming pulses for soft programming the word lines WL2 to WL32 is reduced to 2 shots. It can be seen from FIG. 5B that, despite that the number of programming pulses is reduced to 2 shots, the lower bound of the erase state ERS can still be increased to LB2. Therefore, according to the soft programming method of the embodiment of the disclosure, when performing a soft programming operation on each word line after erasing, the verification result of the first soft programming operation can be used to reduce the number of shots of the programming pulses for the soft programming operations of subsequent word lines, which can raise the lower bound of the erase state ERS and reduce the opportunity of occurrence of leakage current. Therefore, the time of the soft programming operation can be reduced, thereby reducing the total erase time.

Figure 6A:
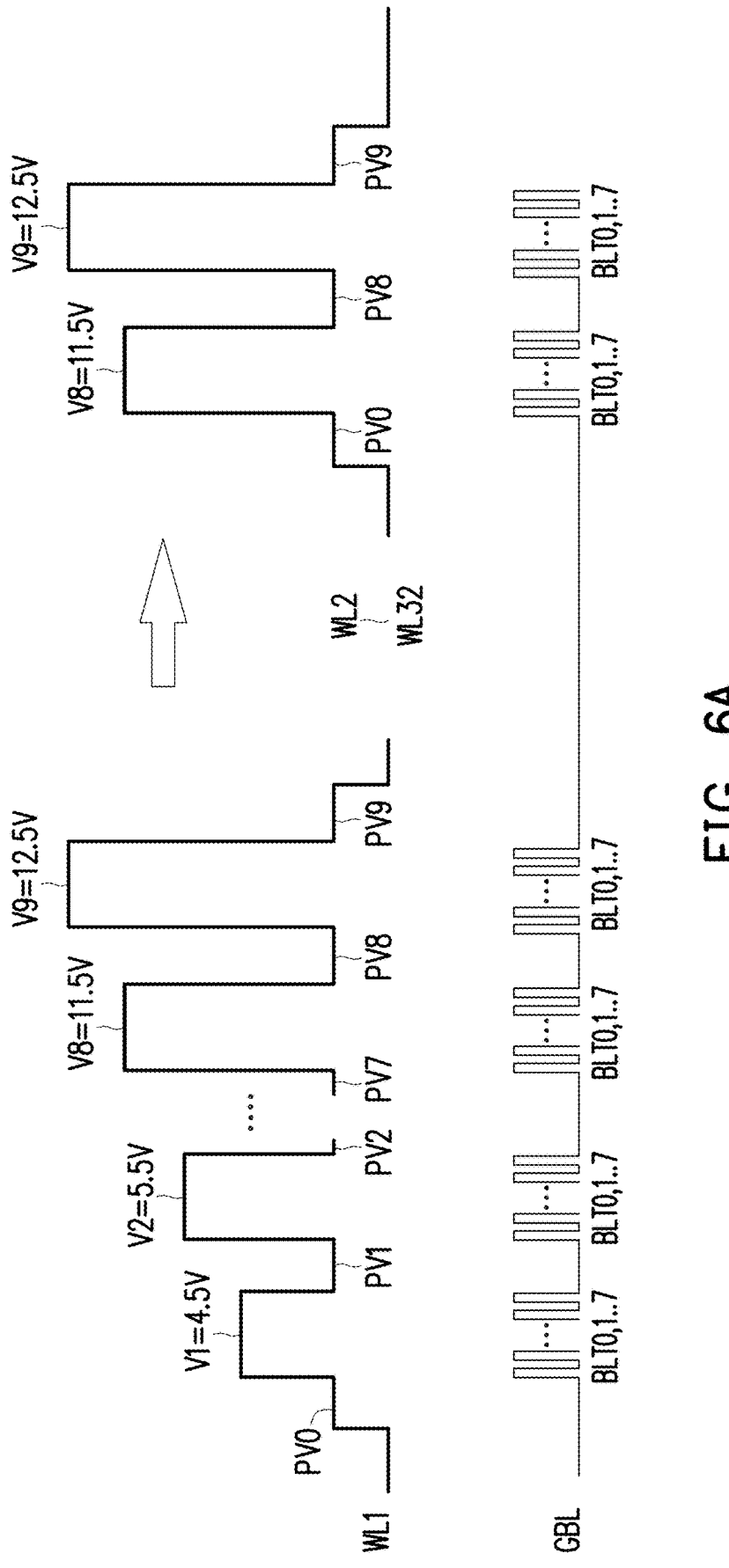
FIG. 6A and FIG. 6B are voltage waveform diagrams of the soft programming operation according to another embodiment of the disclosure.
Figure 6B:
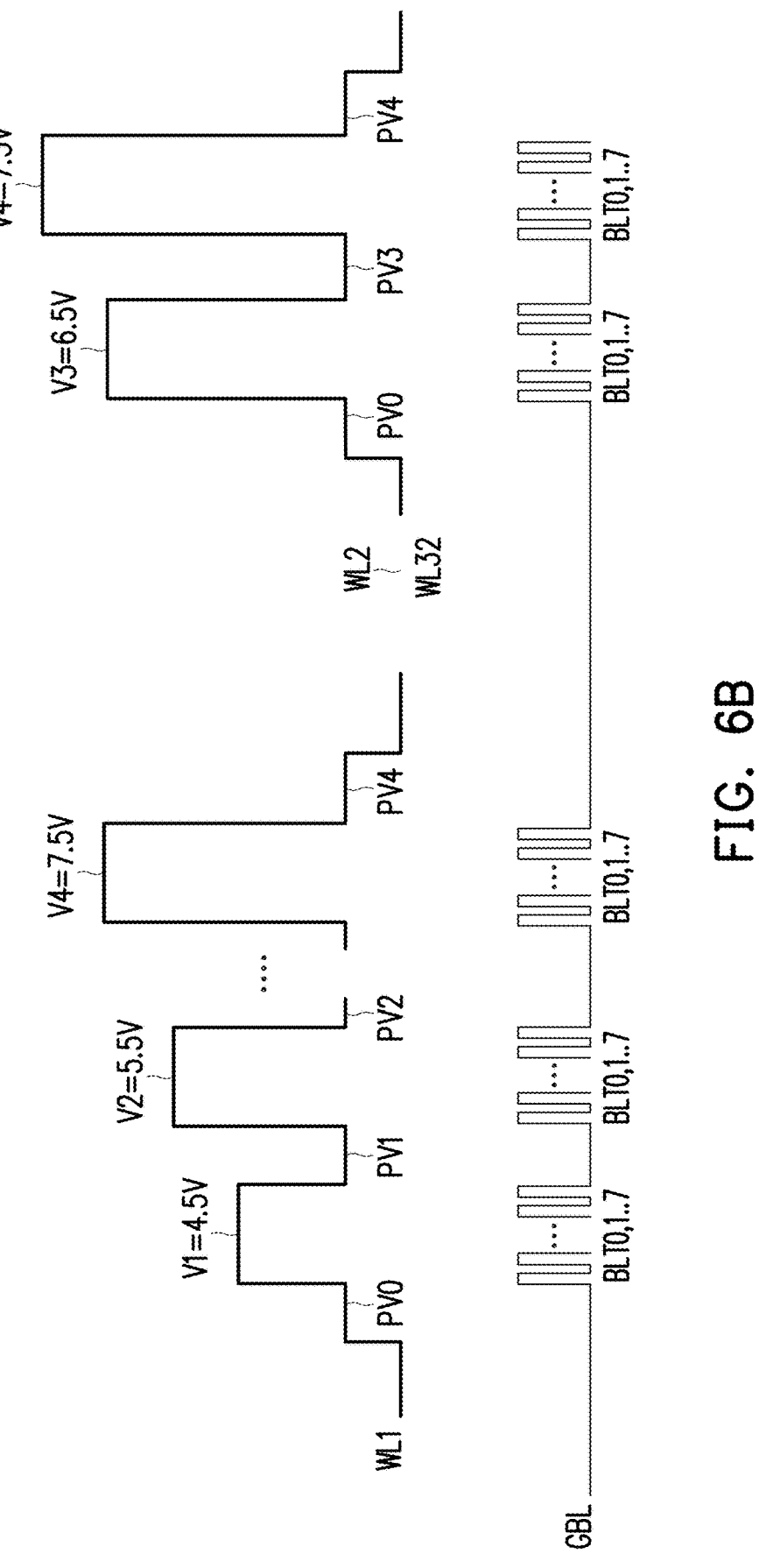

FIG. 6A and FIG. 6B are voltage waveform diagrams of the soft programming operation according to another embodiment of the disclosure. FIG. 6A illustrates a situation of low programming/erasing cycles, that is, a memory device with memory cells that are erased and programmed less frequently. In the low programming/erasing cycles, the memory cells of the memory device are not easily to be programmed, so a larger programming pulse may be required in order to pass verification. In this example, it is assumed that the soft programming operation for the word line WL1 includes 9 shots of programming pulses V1 to V9, and an appropriate programming pulse can be searched from V1=4.5V to V9=12.5V to be fed back to the other word lines WL2 to WL32.

In this example, due to the situation of few times of programming/erasing cycles, the memory cells of the memory device are not easily to be programmed and a higher voltage may be required in order to pass the verification. It is assumed that the word line passes the verification when the programming pulse V9=12.5V is applied. Then, the programming pulse V8=11.5V can be set as the initial value to perform the soft programming operations on the other word lines WL2 to WL32. At this time, the soft programming operations for the other word lines WL2 to WL32 are performed with 2 shots, that is, the programming pulse V8=11.5V and V9=12.5V. Accordingly, the programming pulses for the soft programming operations of the other word lines WL2 to WL32 can be reduced from 9 shots to 2 shots. Nevertheless, 3 shots may also be used to more accurately perform the soft programming operations on the other word lines WL2 to WL32. In that case, the soft programming operations of the other word lines WL2 to WL32 may use the programming pulse V7=10.5V to the programming pulse V9=12.5V.

In addition, in the situation of multiple times of programming/erasing cycles in FIG. 6B, the memory cells of the memory device are erased and programmed more frequently. In the situation of high programming/erasing cycles, the memory cells of the memory device become easily to be programmed. Therefore, when programming the word line, it is not necessary to use a high voltage. The high voltage easily causes memory cell degradation. At this time, as illustrated in FIG. 6B, it is assumed in this example that the soft programming operation for the word line WL1 includes 4 shots of programming pulses V1 to V4, and an appropriate programming pulse can be searched from V1=4.5V to V4=7.5 to be fed back to the other word lines WL2 to WL32.

In this case, due to the multiple times of programming/erasing cycles, the memory cells of the memory device are easily to be programmed, so in the soft programming operation, the programming pulses are not necessary to be applied at a high voltage, and a lower voltage can still pass the verification. As illustrated in FIG. 6B, assuming that the word line passes the verification after the programming pulse V3=6.5V is applied, then the programming pulse V3=6.5V can be set as the initial value to perform the soft programming operations on the other word lines WL2 to WL32. At this time, the soft programming operations for the other word lines WL2 to WL32 are performed with 2 shots, that is, the programming pulse V3=6.5V and the programming pulse V4=7.5V. Accordingly, the programming pulses of the soft programming operations of the other word lines WL2 to WL32 can be reduced to 2 shots. Thus, in the situation of multiple times of programming/erasing cycles, a lower voltage value is used as the initial value, which not only reduces the time for the soft programming operation but also reduces the total erase time. In addition, since the programming pulses with lower voltage values are used, the endurance of the memory cells of the memory device can also be improved.

Figure 7A:
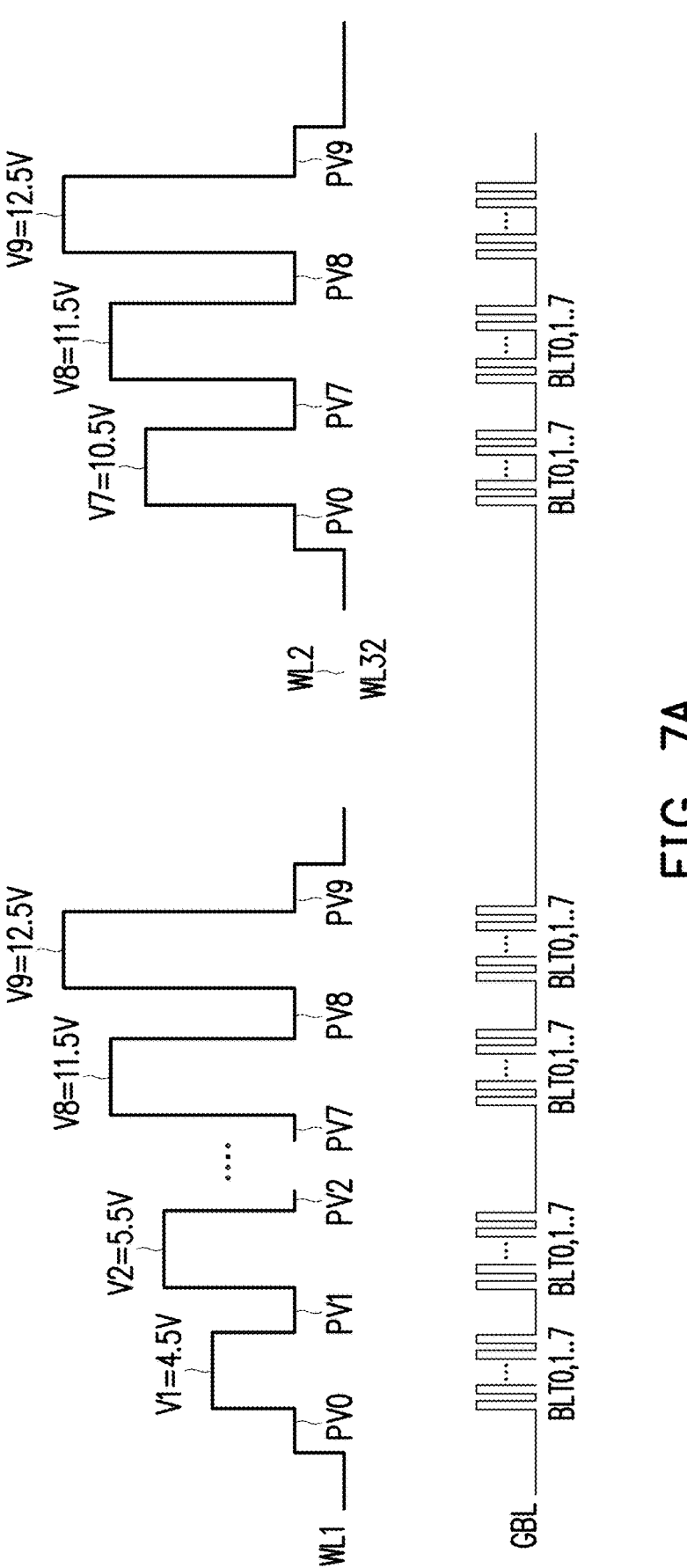
FIG. 7A and FIG. 7B are voltage waveform diagrams of the soft programming operation according to another embodiment of the disclosure.
Figure 7B:
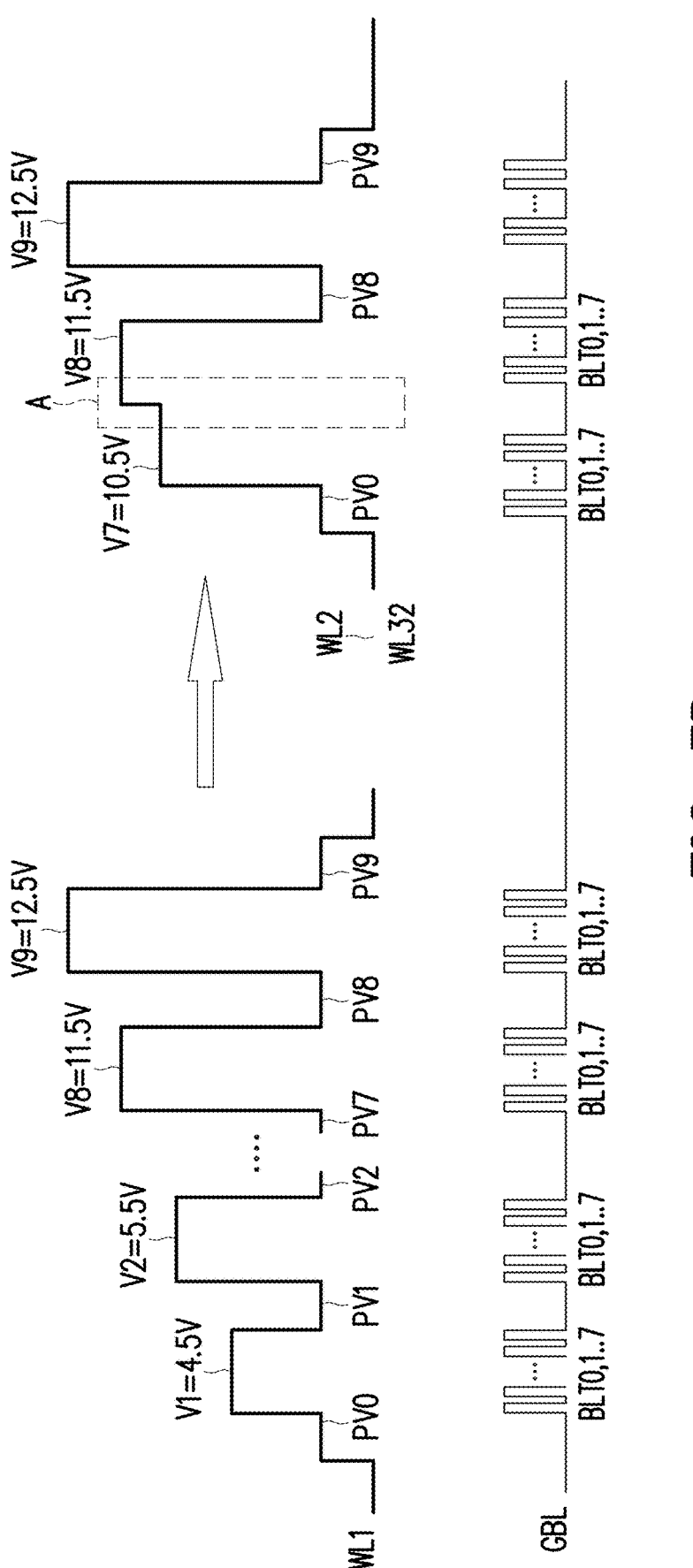

FIG. 7A and FIG. 7B are voltage waveform diagrams of the soft programming operation according to another embodiment of the disclosure. As shown in FIG. 7A, similar to the above embodiment, it is assumed that the verification result of soft programming the word line WL1 is fed back to set the initial value of the programming pulses for the other word lines WL2 to WL32. In this example, it is assumed that the soft programming operation for the word line WL1 includes 9 shots of programming pulses V1 to V9, and an appropriate programming pulse can be searched from V1=4.5V to V9=12.5V to be fed back to the other word lines WL2 to WL32. In this example, it is assumed that, in the soft programming operation of the word line WL1, the word line WL1 passes the verification after the programming pulse V7=10.5V is applied. Then, the subsequent word lines WL2 to WL32 use the programming pulse V7=10.5V as the initial value to perform the soft programming operation. At this time, the number of programming pulses for soft programming the word lines WL2 to WL32 is reduced to 3 shots, that is, the programming pulse V7=10.5V, the programming pulseV8=11.5V, and the programming pulse V9=12.5V.

In addition, as shown in FIG. 7B, the programming pulses for soft programming the word lines WL2 to WL32 shown in FIG. 7A can also be used to save the time of soft programming by omitting the application of the post verification voltage. Here, the soft programming operations for the word lines WL2 to WL32 are to apply 3 shots, that is, the programming pulses V7=10.5V to V9=12.5V. Generally speaking, after each of the programming pulses V7 to V9 is applied, the corresponding post verification voltages PV7 to PV9 are applied for the verification. Here, the post verification voltage PV7 between the programming pulse V7 and the programming pulse V8 can be omitted. Thus, in addition to reducing the programming pulses to 3 shots, the post verification voltage PV7 (see mark A) is also omitted to further reduce the time of the soft programming operation and thereby reduce the total erase time.

Here, the post verification of the penultimate shot, that is, the programming pulse V8, is not omitted. Omitting the post verification voltage PV9 of the last shot of programming pulse V9 usually has no practical benefit, because this soft programming operation ends regardless of whether the verification is passed or not. Besides, this embodiment has reduced the number of shots of programming pulses. If the post verification voltage PV8 of the penultimate shot of programming pulse V8 is omitted, it means that the verifications are not performed during the soft programming operation. Therefore, in general, the post verification voltage that can be omitted may be at least one of PVi to PVm-2, where m-2>i. In this example, m is the number of shots of programming pulses (m=9 in this example), and i is the initial value of the programming pulse fed back to the other word lines (i=7 in this example). In another example, assuming that the initial value of the programming pulse fed back to the other word lines is V6 (i=6), the post verification voltage that can be omitted may be at least one of PV6 and PV7.

Figure 8:
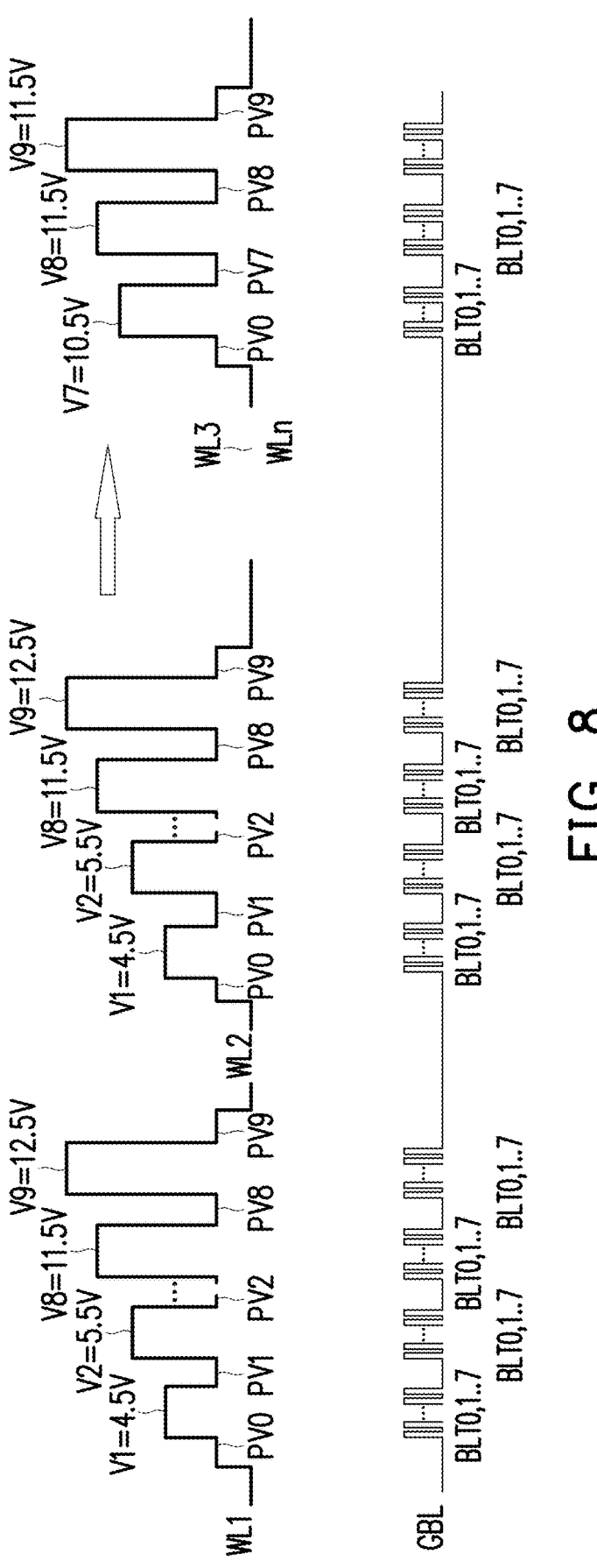
FIG. 8 is a voltage waveform diagram of the soft programming operation according to another embodiment of the disclosure.

FIG. 8 is a voltage waveform diagram of the soft programming operation according to another embodiment of the disclosure. In the above embodiment, the verification result of soft programming one word line (for example, word line WL1) is fed back to the other word lines as the initial value of the programming pulse for performing the soft programming operation. However, in order to more accurately search for the appropriate initial value of the programming pulse, it is possible to use the verification results of soft programming multiple word lines. A modified example will be described below, which uses the verification results of the word lines WL1 and WL2 as references.

In this example, it is assumed that the word lines WL1 and WL2 both fail to pass the verification of the pre-verification voltage PV0, and then the soft programming operations are respectively performed thereon accordingly. Further, the soft programming operations for the word lines WL1 and WL2 are both performed starting from the first shot of nine programming pulses V1 to V9. It is assumed that an optimal programming pulse is searched from V1=4.5V to V9-12.5V and fed back to the other word lines WL3 to WLn. At this time, in both the soft programming operations of the word lines WL1 and WL2, the word lines WL1 and WL2 pass the verification at the seventh shot of programming pulse V7=7.5V.

At this time, the initial values of the programming pulses for the other word lines WL3 to WLn can be determined based on the verification results of the soft programming operations of the word lines WL1 and WL2. In this example, the word line WL1 passes the verification after applying the seventh shot of programming pulse V7=10.5, and the word line WL2 passes the verification after applying the seventh shot of programming pulse V7=10.5. Therefore, the two voltages are averaged (for example, arithmetic averaging) to obtain the average value of 7.5V. Accordingly, the initial value of the programming pulses for the other word lines WL32 to WLn can be set to the programming pulse V7=7.5. Thus, the number of the programming pulses for the other word lines WL3 to WLn can be reduced from 9 shots to 3 shots, thereby reducing the soft programming time and reducing the total erase time.

Although two word lines WL1 and WL2 are illustrated in the above example, the initial value of the programming pulses for other word lines may be determined using the verification results of the soft programming operations of more word lines. By using the verification results of more word lines as a reference, the search for the initial value of the programming pulses for other word lines can be more accurate.

Furthermore, as mentioned above, the word line that serves as a reference is not necessarily the word line WL1, and any other word line may be the start word line. In other words, when the word line WLj (j=1 to n) is determined as the first one of word lines that fails to pass the verification of the pre-verification voltage PV0, resulting in the soft programming operation of applying multiple programming pulses to the word line WLj, the word line WLj is used as a reference. In addition, if k word lines next to the word line WLj also fail to pass the verification of the pre-verification voltage PV0, the initial value of the programming pulses for the other word lines WL (j+k+1) to WLn is further determined based on the verification results of the word lines WLj to WL (j+k), where k is a positive integer and j+k≤n. In addition, in this example, the initial values of the programming pulses determined by the verification results of the word lines WLj to WL (j+k) are averaged so as to determine the initial values of the programming pulses for the other word lines WL (j+k+1) to WLn. In addition, the average may be an arithmetic average.

According to the embodiments of the disclosure, the soft programming method suitable for a 3D NOR flash memory is a method for searching the initial value (voltage) of the programming pulse. The search process makes it easy to find the appropriate bias conditions for subsequent word lines, which not only saves the overall erase time but also improves the endurance in the case of high programming/ erasing cycles.

In summary, the soft programming method provided by the embodiments of the disclosure improves the reliability and performance at a lower cost. In addition, by utilizing the embodiments of the disclosure, the time of the overall erasing operation can be further reduced, and as the method is easy to perform, the chip yield can also be improved.

What is claimed is:

1. A soft programming method for a memory device that comprises n word lines (n is a positive integer), the soft programming method comprising:

applying a pre-verification voltage to each of the n word lines;

applying m programming pulses (m is a positive integer) to a j-th word line among the n word lines, where j is a positive integer smaller than n, wherein the j-th word line is a word line among the n word lines that firstly fails to pass the pre-verification voltage and starts to be applied with the m programming pulses; and determining an initial value of a programming pulse applied to a (j+1)-th word line to an n-th word line based on a verification result of applying the m programming pulses to the j-th word line, wherein in response to an i-th programming pulse, among the m programming pulses applied to the j-th word line, passing a verification, the i-th programming pulse is set as the initial value of the programming pulse applied to the (j+1)-th word line to the n-th word line, where i=1 to m.

2. The soft programming method for the memory device according to claim 1, wherein the j-th word line is a first word line among the n word lines.

3. The soft programming method for the memory device according to claim 1, further comprising:

sequentially applying the i-th programming pulse to an m-th programming pulse to each of the (j+1)-th word line to the n-th word line; and further applying an i-th post verification voltage to an m-th post verification voltage after applying each of the i-th programming pulse to the m-th programming pulse.

4. The soft programming method for the memory device according to claim 3, wherein at least one of verifications of the i-th post verification voltage to an (m-2)-th post verification voltage is not performed, where m-2>i.

5. The soft programming method for the memory device according to claim 1, further comprising:

determining an initial value of a programming pulse applied to a (j+k+1)-th word line to the n-th word line based on the verification result of applying the m programming pulses to the j-th word line to a verification result of applying the m programming pulses to a (j+k)-th word line, where k is a positive integral and j+k<n.

6. The soft programming method for the memory device according to claim 1, further comprising:

determining the initial value of the programming pulse applied to the (j+k+1)-th word line to the n-th word line by averaging the initial value of the programming pulse obtained based on the verification result of applying the m programming pulses to the j-th word line to an initial value of a programming pulse obtained based on the verification result of applying the m programming pulses to the (j+k)-th word line, where k is a positive integral and j+k<n.

7. The soft programming method for the memory device according to claim 6, wherein averaging the initial value is performed by an arithmetic average.

8. The soft programming method for the memory device according to claim 1, wherein the memory device is a 3D NOR flash memory.

9. An erasing method for a memory device that comprises n word lines (n is a positive integer), the erasing method comprising:

applying an erase voltage to a plurality of memory cells on the n word lines to perform a block erase;

applying a pre-verification voltage to each of the n word lines;

applying m programming pulses (m is a positive integer) to a j-th word line among the n word lines, where j is a positive integer smaller than n, wherein the j-th word line is a word line among the n word lines that firstly fails to pass the pre-verification voltage and starts to be applied with the m programming pulses; and determining an initial value of a programming pulse applied to a (j+1)-th word line to an n-th word line based on a verification result of applying the m programming pulses to the j-th word line, wherein in response to an i-th programming pulse, among the m programming pulses applied to the j-th word line, passing a verification, the i-th programming pulse is set as the initial value of the programming pulse applied to the (j+1)-th word line to the n-th word line, where i=1 to m.

10. The erasing method for the memory device according to claim 9, wherein the j-th word line is a first word line among the n word lines.

11. The erasing method for the memory device according to claim 9, further comprising:

sequentially applying the i-th programming pulse to an m-th programming pulse to each of the (j+1)-th word line to the n-th word line; and further applying an i-th post verification voltage to an m-th post verification voltage after applying each of the i-th programming pulse to the m-th programming pulse.

12. The erasing method for the memory device according to claim 11, wherein at least one of verifications of the i-th post verification voltage to an (m-2)-th post verification voltage is not performed, where m-2>i.

13. The erasing method for the memory device according to claim 9, further comprising:

determining an initial value of a programming pulse applied to a (j+k+1)-th word line to the n-th word line based on the verification result of applying the m programming pulses to the j-th word line to a verification result of applying the m programming pulses to a (j+k)-th word line, where k is a positive integral and j+k<n.

14. The erasing method for the memory device according to claim 9, further comprising:

determining the initial value of the programming pulse applied to the (j+k+1)-th word line to the n-th word line by averaging the initial value of the programming pulse obtained based on the verification result of applying the m programming pulses to the j-th word line to an initial value of a programming pulse obtained based on the verification result of applying the m programming pulses to the (j+k)-th word line, where k is a positive integral and j+k<n.

15. The erasing method for the memory device according to claim 14, wherein averaging the initial value is performed by an arithmetic average.

16. The erasing method for the memory device according to claim 9, wherein the memory device is a 3D NOR flash memory.

* * * * *